United States Patent
Chang et al.

(10) Patent No.: US 8,089,313 B2
(45) Date of Patent: Jan. 3, 2012

(54) POWER AMPLIFIER

(75) Inventors: De-Cheng Chang, Kaohsiung (TW);
Yu-Cheng Hsu, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 25 days.

(21) Appl. No.: 12/727,261

(22) Filed: Mar. 19, 2010

(65) Prior Publication Data
US 2011/0090011 A1 Apr. 21, 2011

Related U.S. Application Data

(60) Provisional application No. 61/253,061, filed on Oct. 19, 2009.

(51) Int. Cl.
*H03G 3/20* (2006.01)
(52) U.S. Cl. .......................... 330/136; 330/140
(58) Field of Classification Search .................. 330/136, 330/140, 302
See application file for complete search history.

(56) References Cited

U.S. PATENT DOCUMENTS

| | | | |
|---|---|---|---|
| 3,305,792 A * | 2/1967 | Hans-Jurgen Bobzin | .... 330/133 |
| 6,515,546 B2 | 2/2003 | Liwinski | |
| 6,650,181 B2 * | 11/2003 | Shinjo et al. | .................. 330/136 |
| 6,714,071 B1 * | 3/2004 | Page | .............................. 330/136 |
| 6,803,822 B2 | 10/2004 | Kim et al. | |
| 7,005,923 B2 | 2/2006 | Noh et al. | |

* cited by examiner

*Primary Examiner* — Steven J Mottola
(74) *Attorney, Agent, or Firm* — Jianq Chyun IP Office

(57) ABSTRACT

An adaptive bias power amplifier including an amplifier, a signal coupler, a power detector and a bias control circuit is provided. The signal coupler is connected to an input terminal of the amplifier. The power detector is connected to the signal coupler, and detects an input power of the amplifier via the signal coupler. The bias control circuit is connected to an output terminal of the power detector and the input terminal of the amplifier. The bias control circuit adjusts a gate bias of the amplifier in accordance with a detecting result of the power detector.

11 Claims, 2 Drawing Sheets

POWER AMPLIFIER

CROSS-REFERENCE TO RELATED APPLICATION

This application claims the priority benefit of U.S. provisional application Ser. No. 61/253,061, filed on Oct. 19, 2009. The entirety of the above-mentioned patent application is hereby incorporated by reference herein and made a part of specification.

BACKGROUND OF THE INVENTION

1. Technical Field

The disclosure relates to an amplifier.

2. Description of Related Art

Silicon process techniques such as complementary metal-oxide semiconductor (CMOS) and SiGe have been widely and successfully used in wireless communication electronic circuits. Besides cost and size are considered, a main characteristic of the silicon process technique that various digital and analogic circuits can be integrated in a same process, so as to achieve a purpose of system-on-chip (SoC). However, to achieve a strict device specification for most of the communication systems, in a radio frequency (RF) circuit, besides the RF transceiver is implemented by the CMOS process, key components (for example, a power amplifier and a transceiver switch) of the front end RF circuit are all fabricated by a GaAs process with relatively high cost and better features due to a relatively great loss of the silicon substrate.

Compared to a conventional power amplifier of the GaAs process, disadvantages of a conventional power amplifier of the silicon process include low breakdown voltage, high loss of the silicon substrate and none backside via structure. The low breakdown voltage leads to a fact that the conventional power amplifier has to plan a lower drain bias and a lower alternating current (AC) voltage of an output terminal thereof, so that an optimal impedance of the output terminal of the power amplifier is greatly reduced. Therefore, implementation of impedance matching of the output terminal can lead to a relatively great loss especially on the substrate with higher silicon process loss. Therefore, the power amplifier known to a person of skill in the art implemented by the silicon process has lower efficiency, and remained energy is converted into heat and accumulated in the substrate. The accumulated heat can further influence a characteristic of the conventional power amplifier, such as a gain, an output power, etc.

Moreover, none backside via structure is provided during the CMOS process, so that in case of signal grounding of the amplifier of a common source structure, a bond wire has to be used to connect a printed circuit board or a package outside the chip, which may prolong the signal grounding path, and a parasitic inductance effect can severely influence the efficiency of the power amplifier. To resolve the above problem, a method known to a person of skill in the art is to add a DC-to-DC converter in the circuit or provide a reference voltage through the system, though both circuit structures thereof are complicated, which is of no avail for SoC implementation.

SUMMARY OF THE INVENTION

In an exemplary embodiment, there is provided a power amplifier, in which the gate bias of the power amplifier is dynamically adjusted according to an input power, so as to improve an efficiency of the power amplifier through adaptive bias.

The present invention provides a power amplifier including an amplifier, a signal coupler, a power detector and a bias control circuit. The signal coupler is connected to an input terminal of the amplifier. The power detector is connected to the signal coupler, and detects an input power of the amplifier via the signal coupler. The bias control circuit is connected to an output terminal of the power detector and the gate of the amplifier. The bias control circuit adjusts a gate bias of the amplifier in accordance with a detecting result of the power detector.

According to the above description, in the exemplary embodiment, the power detector is used to detect the input power of the amplifier, and then the bias control circuit adjusts the gate bias of the amplifier according to the input power of the amplifier, so as to improve the efficiency of the power amplifier. Moreover, according to a feature that a drain current of a field-effect transistor (FET) is in inverse proportion to temperature while amplifier is biased in class A manner, the quiescent current of power amplifier was reduced when operated temperature was increase. This feature generate a reduction of the gain which aggravate the linearity. By using the characteristic that the drain current of FET is in direct proportion to temperature while its gate bias is near the threshold voltage, the gain reduction of the amplifier operated in high temperature is compensated. Therefore, the power amplifier of the present invention has advantages of temperature compensation and linearity improvement.

In order to make the aforementioned and other features and advantages of the present invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

A direct current (DC) bias of a power amplifier known to a person of skill in the art is fixed. During the operation of the power amplifier known to a person of skill in the art, the fixed bias leads to a fixed DC power consumption, so that when the power amplifier known to a person of skill in the art is operated in a low power region, an efficiency of the power amplifier is greatly reduced. Namely, most of the DC electric energy is converted into heat to increase an operation temperature. The high operation temperature influences a characteristic of the power amplifier. To mitigate the shortcoming of low efficiency of the power amplifier operated in the low power region, according to a method known to a person of skill in the art, the DC bias of the amplifier is design to have a low bias value. Such method can effectively reduce the DC power consumption of the amplifier to improve the efficiency.

However, when the power amplifier is operated in a high power region, the low DC bias can lead to a reduction of linearity of the amplifier.

Figure 1:
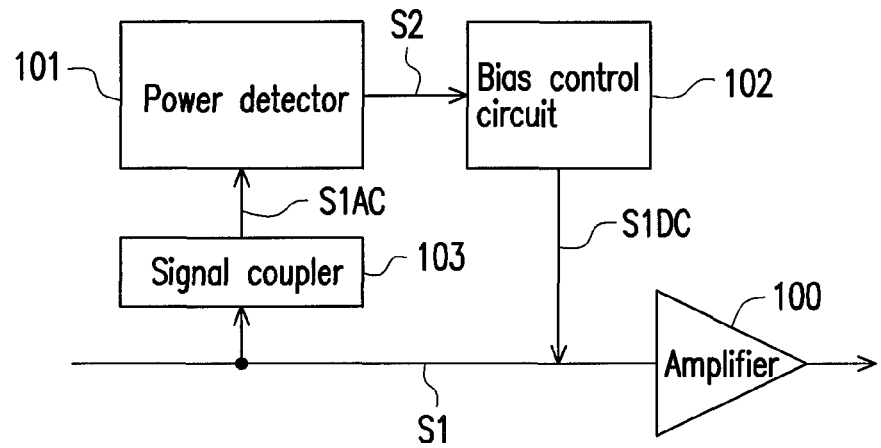
FIG. 1 is a functional block diagram of a power amplifier according to an embodiment of the present disclosure.

FIG. 1 is a functional block diagram of a power amplifier according to an embodiment of the present disclosure. The power amplifier includes an amplifier 100, a power detector 101, a bias control circuit 102 and a signal coupler 103. The signal coupler 103 is connected between an input terminal of the amplifier 100 and a detecting terminal of the power detector 101. The signal coupler 103 blocks direct current (DC) components of a signal S1 of the input terminal of the amplifier 100, and transmits alternating current (AC) components of signal S1 to the detecting terminal of the power detector 101.

The detecting terminal of the power detector 101 detects an input power of the amplifier 100 through the signal coupler 103 and transmits a detecting result S2 to the bias control circuit 102. The bias control circuit 102 is connected to an output terminal of the power detector 101 and the gate of the amplifier 100. The bias control circuit 102 outputs a DC bias according to the detecting result S2 of the power detector 101, so as to change the gate bias of the amplifier 100. If the input power of the amplifier 100 is increased, the bias control circuit 102 correspondingly increases the gate bias of the amplifier 100. If the input power of the amplifier 100 is decreased, the bias control circuit 102 correspondingly decreases the bias of the gate bias of the amplifier 100. Compared to the fixed DC bias of the technique known to a person of skill in the art, the DC bias of the amplifier 100 of the present embodiment can be adjusted according to the magnitude of the input power, so that in the power amplifier of the present embodiment, the efficiency of the power amplifier operated in the low power region and the linearity of the power amplifier operated in the high power region are simultaneously considered.

Generally, when the operation temperature is increased, a gain of the amplifier 100 is correspondingly reduced. In the present embodiment, the power detector 101 can further detect the operation temperature. If the operation temperature is increased, the power detector 101 correspondingly adjusts the detecting result S2, so that the bias control circuit 102 correspondingly increases the DC bias of the input terminal of the amplifier 100. If the operation temperature is decreased, the power detector 101 correspondingly adjusts the detecting result S2, so that the bias control circuit 102 correspondingly decreases the DC bias of the input terminal of the amplifier 100. Therefore, a shortcoming of gain reduction of the amplifier during the high temperature operation can be compensated.

Figure 2:
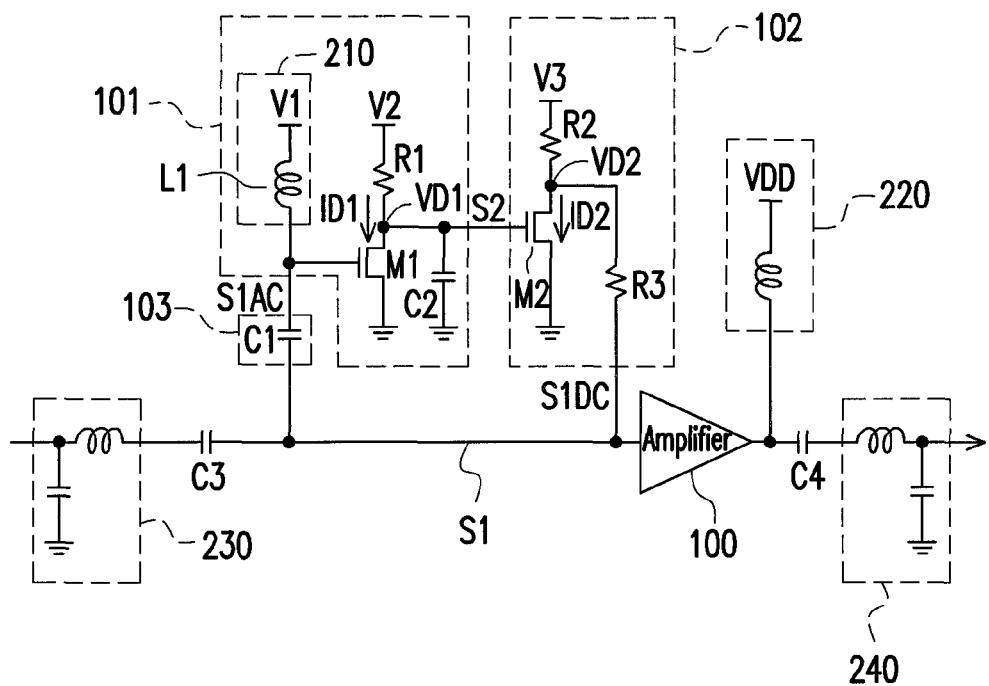
FIG. 2 is a schematic diagram illustrating an example of a power amplifier of FIG. 1.

FIG. 2 is a schematic diagram illustrating an example of the power amplifier of FIG. 1. An input impedance matching unit 230, a DC blocking capacitor C3, a RF chocking inductor 220, a DC blocking capacitor C4 and an output impedance matching unit 240 illustrated in FIG. 2 are selectively configured according to an actual design requirement. The input impedance matching unit 230 is connected to the input terminal of the amplifier 100 through the capacitor C3. The output impedance matching unit 240 is connected to the output terminal of the amplifier 100 through the capacitor C4. The RF choking inductor 220 is connected to the output terminal of the amplifier 100.

Referring to FIG. 2, the signal coupler 103 includes a first capacitor C1. A first end and a second end of the first capacitor C1 are respectively connected to the input terminal of the amplifier 100 and the detecting terminal of the power detector 101. The power detector 101 includes a choke inductor 210, a first transistor M1, a first resistor R1 and RF shorting capacitor C2. The choke inductor 210 is connected to the signal coupler 103. A first end of the first inductor L1 is connected to the signal coupler 103 and a control terminal (for example, a gate) of the first transistor M1, and a second end of L1 is connected to a first voltage V1. The first voltage V1 is a certain fixed reference voltage determined according to an actual design requirement. For example, the first voltage V1 can be set within a range of 0.8V-1.05V.

The first transistor M1 can be an N-channel metal oxide semiconductor (NMOS) field-effect transistor. A first terminal (for example, a drain) of the first transistor M1 is connected to a first end of the first resistor R1, and a second terminal (for example, a source) of the first transistor M1 is connected to a reference voltage (for example, a ground voltage). A second end of the first resistor R1 is connected to a second voltage V2. The second voltage V2 is a certain fixed voltage determined according to an actual design requirement. For example, the second voltage V2 can be set as a system voltage VDD. A first end of the second capacitor C2 is connected to the first end of the first resistor R1, and a second end of the second capacitor C2 is connected to the reference voltage (for example, the ground voltage).

The bias control circuit 102 includes a second transistor M2, a second resistor R2 and a third resistor R3. The second transistor M2 can be an NMOS transistor. A control terminal (for example, a gate) of the second transistor M2 is connected to the output terminal of the power detector 101, i.e. connected to the first end of the first resistor R1. A first terminal (for example, a drain) of the second transistor M2 is connected to a first end of the second resistor R2. A second terminal of the transistor M2 is connected to the reference voltage (for example, the ground voltage). A second end of the second resistor R2 is connected to a third voltage V3. The third voltage V3 is a certain fixed voltage determined according to an actual design requirement. For example, the third voltage V3 can be set as the system voltage VDD. A first end of the third resistor R3 is connected to the first end of the second resistor R2, and a second end of the third resistor R3 is connected to the input terminal of the amplifier 100.

When the signal S1 is input to the amplifier 100 through the input terminal, the AC components S1AC of the signal S1 are input to the power detector 101 through the signal coupler 103. As described above, the power detector 101 consists of the transistor M1 of a low gate bias, the resistor R1 and the signal grounding capacitor C2. Based on a characteristic that a drain current ID1 is increased when the transistor M1 approaches saturation, a voltage drop is formed at a node VD1. A signal (the detecting result S2) output from the drain of the power detecting transistor M1 is coupled to the ground through the signal grounding capacitor C2, so as to avoid the AC components of the signal S1 influencing the bias control circuit 102.

The bias control circuit 102 includes the transistor M2 and the two resistors R2 and R3. When a level of the detecting result S2 is decreased, a drain current ID2 of the bias control transistor M2 is accordingly deceased, so that a drain voltage of the bias control transistor M2 is increased as the power of the input signal S1 is increased. Due to a none current characteristic of the gate of the field-effect transistor (FET) M2, the third resistor R3 with a large resistance can be used to guide the drain voltage of the transistor M2 to the input terminal of the amplifier 100 without using a voltage buffer. In this way, a circuit complexity degree is effectively reduced. Therefore, as the drain voltage of the transistor M2 increases, the resistor R3 correspondingly boosts the DC bias S1DC of the input terminal of the amplifier 100, so as to achieve an adaptive bias.

Therefore, in case of a high input power, operation behaviour of the power amplifier of FIG. 2 is similar to a class A amplifier, and in case of a low input power, the operation behaviour of the power amplifier of FIG. 2 is similar to a class AB amplifier. The operation mode of the adaptive bias can effectively increase the efficiency of the power amplifier operated at the low power region, and can simultaneously satisfy a linearity requirement of the power amplifier operated at the high power region.

An influence of the accumulated heat in the substrate to the power amplifier of FIG. 2 is described below. In the present embodiment, on the premise of without increasing the complexity of the schematic, a characteristic variation of the amplifier caused by temperature increase is modified by selecting a gate bias of the power detecting transistor M1, and a concept thereof is described as follows.

Figure 3:
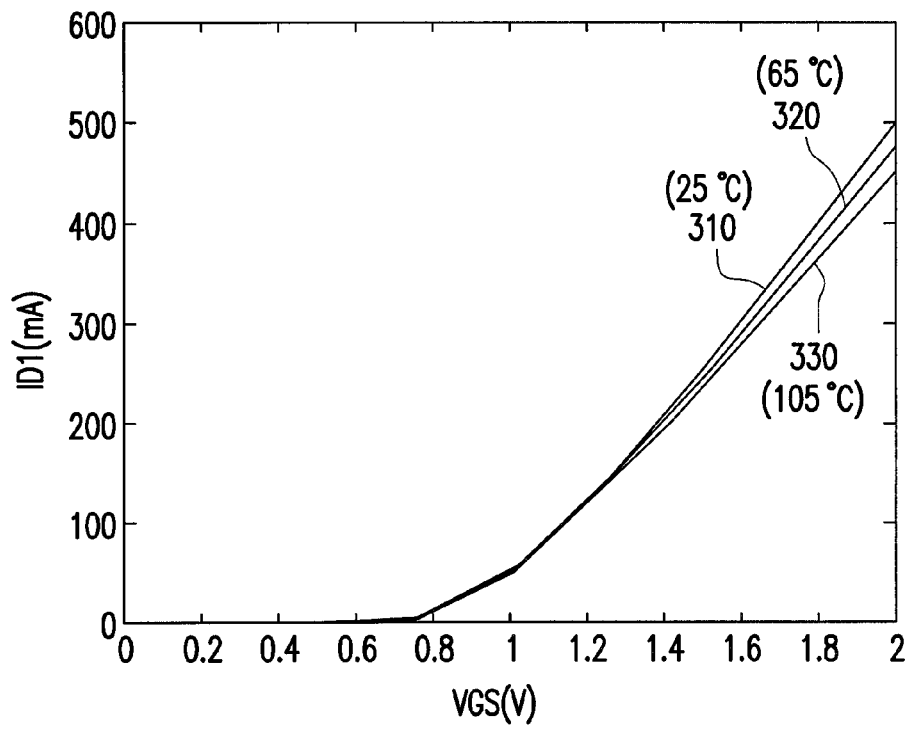
FIG. 3 is a diagram illustrating variations of a drain current ID1 of a first transistor M1 of a power amplifier of FIG. 2 under different gate biases VGS and different temperatures.

FIG. 3 is a diagram illustrating variations of the drain current ID1 of the transistor M1 of the power amplifier of FIG. 2 under different gate biases VGS and different temperatures. In FIG. 3, a horizontal axis represents gate-source/drain voltages VGS of the transistor M1, and a vertical axis represents the drain currents ID1 of the first transistor M1. As shown in FIG. 3, feature curves 310, 320 and 330 respectively represent variations of the gate bias VGS of the transistor M1 relative to the drain current ID1 when the transistor M1 is respectively operated under temperatures of 25° C., 65° C. and 105° C. According to FIG. 3, it is known that when the power amplifier is operated under a relatively higher gate bias VGS, for example, the gate bias VGS is greater than 1.2V, the drain current ID1 of the transistor M1 has a negative temperature coefficient. Although the characteristic of the negative temperature coefficient can suppress a thermal run away effect of the amplifier, when the amplifier is operated in the high power region, the transistor M1 is influenced by the increased temperature of the silicon substrate, and the drain current ID1 is decreased for a certain degree, so that the characteristic of the negative temperature coefficient may also result in attenuation of the gain and a maximum linear power of the amplifier 100. To resolve such problem, in the present embodiment, the gate bias VGS of the transistor M1 of the power detector 101 is set in a positive temperature coefficient region, for example, a region of 0.6V-1.1V in FIG. 3.

Figure 4:
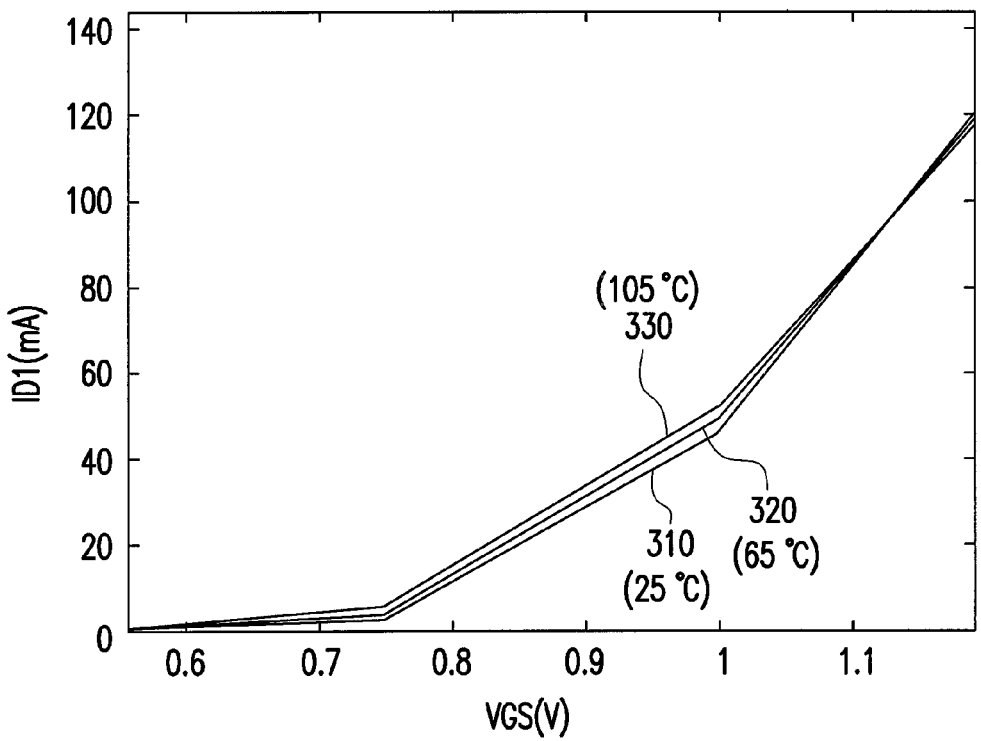
FIG. 4 is a partial enlarged diagram of a positive temperature coefficient region of FIG. 3.

FIG. 4 is a partial enlarged diagram of the positive temperature coefficient region of FIG. 3. According to a setting of the first voltage V1, the gate bias VGS of the transistor M1 can be set in the positive temperature coefficient region. When the temperature is increased, the drain current ID1 of the power detecting transistor M1 is slightly increased, so that the drain voltage (i.e. VD1) is decreased, which may increase the drain voltage (i.e. VD2) of the bias control transistor M2, and therefore the DC bias S1DC of the input terminal of the amplifier 100 is boosted. Therefore, in case of the high temperature, the DC bias S1DC of the input terminal of the amplifier 100 is slightly increased to compensate the attenuation of the gain and the maximum linear power of the amplifier 100. Namely, in the present embodiment, by selecting the gate bias VGS of the power detecting transistor M1, the drain current of the transistor M1 is proportional to temperature, so that when the temperature is increased, the drain current of the power amplifier is increased to compensate the drain current attenuation caused by the temperature increase.

In summary, in the present invention, the efficiency of the power amplifier operated at a linear region can be effectively improved by adjusting the DC bias of the input terminal of the amplifier 100. Moreover, according to a feature that the drain current of the field-effect transistor (FET) has different temperature coefficients as the temperature is varied, a shortcoming of gain reduction of the amplifier operated in high temperature is compensated. Therefore, a silicon process can be used to design the adaptive bias, and with collaboration of the temperature compensation structure, the CMOS power amplifier is implemented, so as to achieve a purpose of system-on-chip (SoC) and improve the efficiency of the CMOS power amplifier and compensate instability of the drain current relative to the temperature variation.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A power amplifier, comprising:
   an amplifier;
   a signal coupler, connected to an input terminal of the amplifier;
   a power detector, connected to the signal coupler, for detecting an input power of the amplifier, wherein the power detector comprises:
   a first choke inductor, connected to the signal coupler;
   a first transistor, having a control terminal connected to the first choke inductor;
   a first resistor, having a first end connected to a first terminal of the first transistor; and
   a second capacitor, connected to the first end of the first resistor; and
   a bias control circuit, connected to an output terminal of the power detector and the gate of the amplifier, and adjusting a gate bias of the amplifier in accordance with a detecting result of the power detector.

2. The power amplifier as claimed in claim 1, wherein if the input power of the amplifier is increased, the bias control circuit increases the gate bias of the amplifier, and if the input power of the amplifier is decreased, the bias control circuit decreases the gate bias of the amplifier.

3. The power amplifier as claimed in claim 1, wherein the power detector further detects an operation temperature, wherein if the operation temperature is increased, the power detector controls the bias control circuit to correspondingly increase the gate bias of the amplifier, and if the operation temperature is decreased, the power detector controls the bias control circuit to correspondingly decrease the gate bias of the amplifier.

4. The power amplifier as claimed in claim 1, wherein the signal coupler blocks direct current (DC) components of a signal from the input terminal of the amplifier.

5. The power amplifier as claimed in claim 1, wherein the signal coupler comprises a first capacitor, and a first end and a second end of the first capacitor are respectively connected to the input terminal of the amplifier and a detecting terminal of the power detector.

6. The power amplifier as claimed in claim 1, wherein a second terminal of the first transistor is connected to a reference voltage.

7. The power amplifier as claimed in claim 1, wherein a second end of the first resistor is connected to a second voltage.

8. The power amplifier as claimed in claim 1, wherein the bias control circuit comprises:
   a second transistor, having a control terminal connected to the output terminal of the power detector;

a second resistor, having a first end connected to a first terminal of the second transistor; and a third resistor, having a first end connected to the first end of the second resistor, and a second end connected to the input terminal of the amplifier.

9. The power amplifier as claimed in claim 1, further comprising:

an input impedance matching unit, connected to the input terminal of the amplifier; and an output impedance matching unit, connected to an output terminal of the amplifier.

10. The power amplifier as claimed in claim 9, further comprising:

a third capacitor, connected between the input impedance matching unit and the input terminal of the amplifier; and a fourth capacitor, connected between the output terminal of the amplifier and the output impedance matching unit.

11. The power amplifier as claimed in claim 10, further comprising a second choke inductor connected to the output terminal of the amplifier.

* * * * *